United States Patent [19]

Ogawa et al.

[11] Patent Number: 5,252,855
[45] Date of Patent: Oct. 12, 1993

[54] LEAD FRAME HAVING AN ANODIC OXIDE FILM COATING

[75] Inventors: Yoshiaki Ogawa; Hiroyuki Noguchi, both of Sagamihara, Japan

[73] Assignee: Mitsubishi Denki Kabushiki Kaisha, Tokyo, Japan

[21] Appl. No.: 775,549

[22] Filed: Oct. 15, 1991

[30] Foreign Application Priority Data

Oct. 25, 1990 [JP] Japan ................................. 2-285942

[51] Int. Cl.⁵ ..................... H01L 23/48; H01L 29/44; H01L 39/02; H01L 29/46
[52] U.S. Cl. .................................. 257/676; 257/666; 257/675; 257/781; 257/782; 257/783; 257/798; 257/746; 257/794
[58] Field of Search ............... 357/71, 67, 68, 65, 357/70; 257/650, 739, 761, 764, 666, 675, 676, 781, 782, 783, 798, 746, 794

[56] References Cited

U.S. PATENT DOCUMENTS 4,248,675 2/1981 Bozler et al. ........................ 357/68

FOREIGN PATENT DOCUMENTS 2113563 4/1990 Japan .

Primary Examiner—Andrew J. James
Assistant Examiner—Carl Whitehead, Jr.
Attorney, Agent, or Firm—Oblon, Spivak, McClelland, Maier & Neustadt

[57] ABSTRACT

Lead frames, in which at least one part of the surface of a metal member which is a part of the lead frame is provided with an anodic oxide film of copper or a copper alloy, and in which a member composed substantially of a resin film or a resin plate is connected to the lead frame through this anodic oxide film by gluing or pressing under heat exhibit good adhesion between the metal member and the resin film or plate. Similarly, lead frames constructed with at least two metal members, having a portion of the surface provided with an anodic oxide film of copper or a copper alloy, and in which these metal members are joined together through this anodic oxide film exhibit good adhesion between the metal members.

6 Claims, 5 Drawing Sheets

LEAD FRAME HAVING AN ANODIC OXIDE FILM COATING

BACKGROUND OF THE INVENTION

1. Field of the Invention

This invention relates to a lead frame to be used for a semiconductor package device, and a method for its production. More particularly, it is concerned with such lead frame with improved reliability, one part of which is constructed with a resin material.

2. Description of Prior Art

In general, a lead frame for use in a semiconductor package is made by punching with a pressing machine or by etching of a plate material composed of a copper alloy or an iron alloy. In other words, a lead frame to be used in one semiconductor package is constituted with a single kind of metal.

In particular, however, for an integrated circuit package, there have been proposed various types such as one, in which a member made of a metal material is joined with a member made of a resin material, or one, in which a plurality of members, each being made of different kind of metal materials, are joined together, or combined types of these, not to construct the lead frame for use in a single package with one and same metal material, for the reasons to be derived from various factors such as size reduction and versatility of the packages in recent years, increase in the size of integrated circuit elements and the number of input/output terminals, and so forth.

In an attempt to appropriate a single lead frame for the integrated circuit elements in varying sizes, there has been proposed, for example, in the package of ASIC (Application Specific IC), etc., a lead frame of a type, in which a member for mounting thereon the integrated circuit elements (element-mounting member) is constructed with a resin film, in place of using metal, which is glued to the inner leads.

Also, in ZIP (zig-zag inline package) of 4 M DRAM, etc., as the size of the integrated circuit elements becomes very large against the limitation of the package size, routing of the inner lead becomes difficult. On account of this, there has been made publicly known a lead frame of a type such that the resin film as the element-mounting member is joined with the inner leads, on which resin film the integrated circuit elements are mounted and glued.

Further, with increase in power consumption accompanied by increase in the size of the integrated circuit element as well as in the degree of integration, heat-generating quantity increases during the operations of the integrated circuit, with the consequent apprehension such that heat dissipation becomes insufficient in the conventional packages, in general, and the temperature of the elements progressively rises to become the factors of the erroneous operations and disorders in the integrated circuit elements. In a package where the heat dissipation becomes a problem, e.g., in such package that is called power QFP (Quad Flat Package), as an example, there has been published a lead frame of a structure, in which a metal plate of good heat conductivity is used for an element mounting member, with which inner leads are glued together by way of a resin material.

Various constructions exist for such a lead frame, and the basic structure is that a member made of a metal material and a member made of a resin material are joined together by gluing or pressing under heat, and that has a typical cross-sectional profile as shown in FIG. 5 of the accompanying drawing. In this drawing, a reference numeral 1 designates an inner lead constituting a part of the lead frame made of a copper alloy or an iron alloy; a numeral 2 refers to a resin film composed of a resin material such as polyimide, etc.; and a numeral 3 denotes a resin type adhesive agent to join the inner lead 1 with the resin film 2. Further, the resin film 2, as an element-mounting member, joins a semiconductor element 4 with the resin type adhesive agent 3, thereby wire-bonding both the semiconductor element 4 and the inner lead 1 with a thin metal wire 5 to be electrically connected.

As mentioned above, the conventional lead frame is of such a construction that the resin film 2 is directly joined with the inner lead 1 made of a copper alloy or an iron alloy by means of the resin type adhesive 3. In general, however, the adhesive force between the resin type adhesive agent and these metal materials is not necessarily sufficient. On account of this, it is apprehended that, due to shear stress to be exerted at the time of bending work of the lead during the assembling step of the semiconductor package, or thermal stress to be applied under various heating environment, or else, adhesiveness at the above-mentioned adhesive interface becomes decreased to bring about very fine gaps between them. In such case, when moisture-adsorption takes place in the package, water is condensed in these small gaps, and this condensed water, when heated again, becomes vaporized to expand its volume to lead to a possible danger of bringing about cracks in the semiconductor package. Therefore, improvement in the adhesive force between the resin member and the metal member is of paramount importance on the operational reliability of the semiconductor package.

SUMMARY OF THE INVENTION

The present invention has been made with a view to solving the above-mentioned problem, and aims at providing a lead frame, in which a resin member and a metal member, or the metal members themselves are mutually joined with sufficient adhesive force, and also providing a method for producing such lead frame.

According to one aspect of the present invention, there is provided a lead frame which is characterized in that at least one surface part of a metal member constituting a part of the lead frame is provided thereon with an anodic oxide film of copper or a copper alloy, and that a member composed substantially of a resin film or a resin plate is disposed on one part of the lead frame through this anodic oxide film by gluing or pressing under heat.

According to another aspect of the present invention, there is provided a lead frame constructed with at least two metal members, and which is characterized in that the joining surfaces of the metal members are provided with an anodic oxide film of copper or a copper alloy, and these metal members are joined together through this anodic oxide film.

According to other aspect of the present invention, there is provided a method for producing a lead frame, which comprises: electrolyzing, in an alkaline solution, a lead frame member as the anode, at least the surface part of which is substantially composed of copper or a copper alloy, to thereby form on the surface of the lead frame composed of copper or a copper alloy an anodic oxide film of copper having as its principal structure an aggregate of acicular crystals having gaps among them; and thereafter, joining a member made substantially of a resin film or a resin plate by gluing or pressing under heat onto the surface of the lead frame member, on which the anodic oxide film has been formed.

According to still other aspect of the present invention, there is provided a method for producing a lead frame, which comprises: electrolyzing, in an alkaline solution, two or more lead frame members as the anode, at least the surface part of which is substantially composed of copper or a copper alloy, to thereby form on the surface of the lead frame composed of copper or a copper alloy an anodic oxide film of copper having as its principal structure an aggregate of acicular crystals having gaps among them; and thereafter, joining the lead frame members by gluing with a resin type adhesive through the anodic oxide film thus formed.

The foregoing objects, other objects as well as specific construction of the lead frame according to the present invention as well as the method steps for its production will become more apparent and understandable from the following detailed description, when read in conjunction with the accompanying drawing.

BRIEF DESCRIPTION OF THE ACCOMPANYING DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

The method of producing a lead frame according to the present invention resides in electrolysis of a lead frame member, as the anode, the substantial surface composition of which consists of copper or a copper alloy, in an alkaline solution, to thereby form an oxide film of copper on the surface of the lead frame member as the electrode reaction product; the thus formed copper oxide film attains a crystal growth, by the effect of an anodic electrolysis, to take its principal crystal structure with an aggregate of acicular crystals having gaps among them as the principal structure. The copper oxide film of such structure cannot be obtained by other copper oxide forming methods such as, for example, the copper oxide film forming method by chemical reaction, or the copper oxide film forming method by heating, or others.

The lead frame of the present invention to be obtained by the above-described anodic oxidation process is of such construction that the anodic oxide film of copper or a copper alloy is formed on the surface of the metal member to be joined with a resin member by gluing or pressing under heat, or on the surfaces of the metal members to be mutually joined, the anodic oxide film being principally composed of an aggregate of acicular crystals having gaps among them. With such construction, the adhesive agent or the resin which is given its fluidity during the heat-pressing step penetrates into the innumerable gaps present in the above-mentioned anodic oxide film, and becomes solidified to thereby exhibit the anchoring effect against the shear force or peeling force to be exerted on the interface between the metal member and the adhesive agent, or between the metal member and the resin member, thereby rendering the adhesiveness at this interface to be extremely strong.

With a view to enabling those persons skilled in the art to put the present invention into practice, the following preferred examples are presented.

Figure 1:
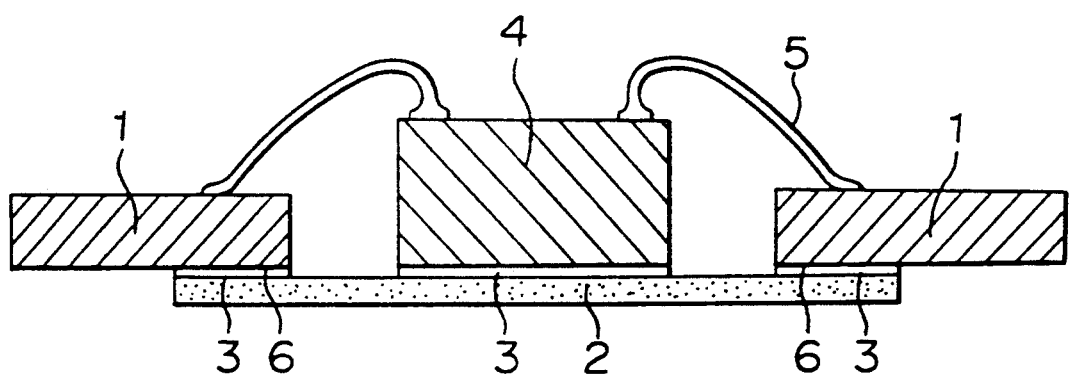
FIG. 1 is a cross-sectional view of a lead frame according to one embodiment of the present invention.
Figure 2:
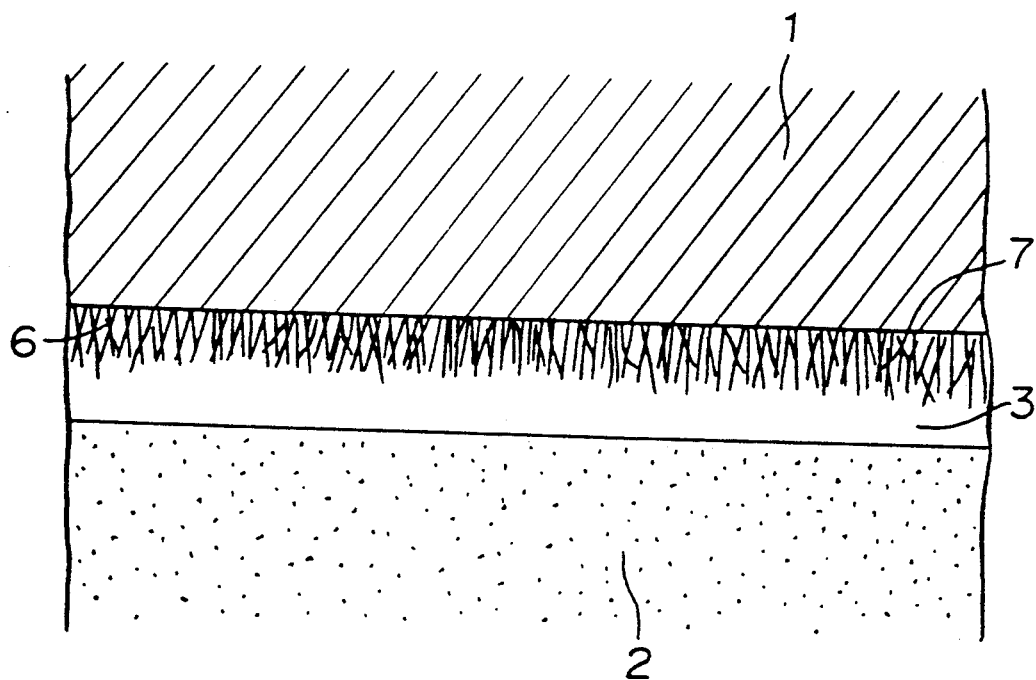
FIG. 2 is a schematic representation showing the cross-section of the joining interface between an inner lead and a resin film in a lead frame.

FIG. 1 is a cross-sectional view of the lead frame according to one embodiment of the present invention, and FIG. 2 is a schematic representation showing the cross-section of the interface for joining the metal member and the resin member in this lead frame. In the ensuing explanations made in reference to the accompanying drawing, the same reference numerals in each figure of drawing designate the identical or corresponding parts.

In the drawing, a reference numeral 6 designates the anodic oxide film of copper or a copper alloy formed on the surface of the inner lead 1 constituting a part of the lead frame of copper alloy, and the inner lead 1 which is the metal member and the resin film 2 such as polyimide, etc. which is the resin member are joined together by the resin type adhesive agent 3 through this anodic oxide film 6.

This anodic oxidation film 6, seen microscopically, is principally constructed with an aggregate of acicular crystals 7 having gaps among them. In the above-described interface for adhesion, the resin type adhesive agent 3 given its fluidity penetrates into the innumerable gaps formed by the aggregate of the acicular crystals 7, and becomes solidified therein. On account of this, there hardly takes place the peeling phenomenon at this adhesion interface, even when impact force and thermal stress are exerted between the inner lead 1 and the resin film 2.

Figure 3:
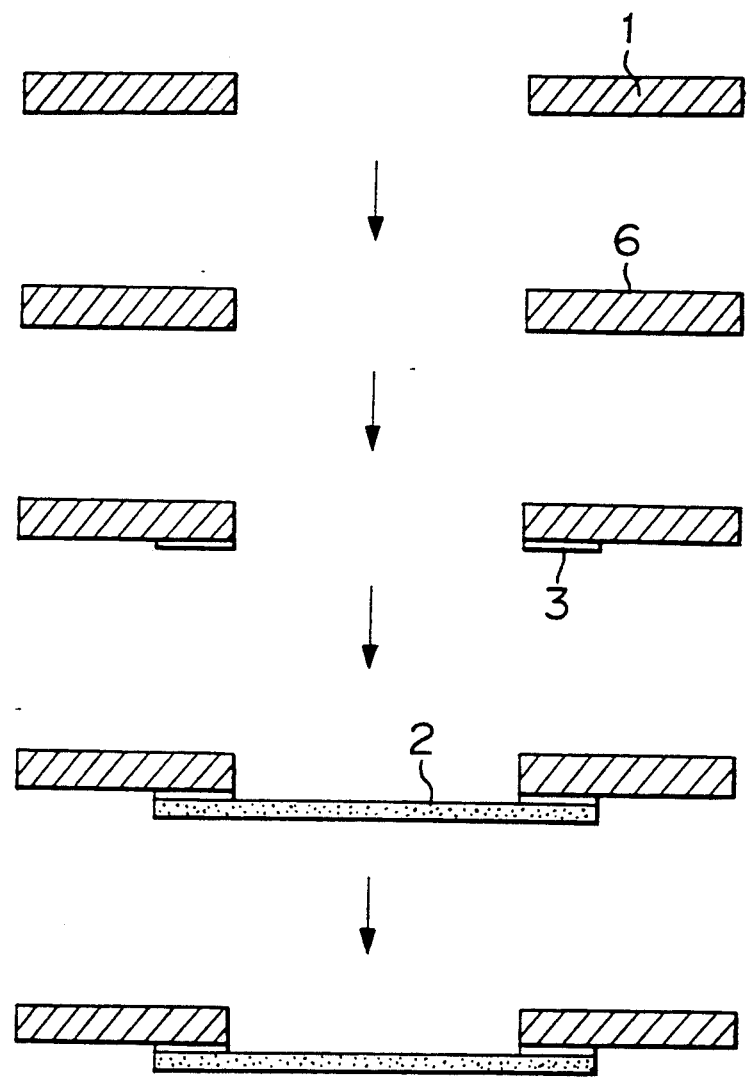
FIG. 3 illustrates the steps of manufacturing a lead frame according to one embodiment of the present invention.

FIG. 3 is a diagram showing one embodiment of the process steps for producing the above-mentioned lead frame, which illustrates changes in the cross-sectional profile in every fabrication step. First of all, the metal member of the lead frame composed of a copper alloy, which has been shaped by punching work with a pressing machine, or etching work, is subjected to the anodic oxidation in an alkaline solution, thereby forming on the surface of the metal member inclusive of the inner lead 1 the anodic oxide film 6 of copper or a copper alloy composed principally of an aggregate of acicular crystals (not shown in the drawing) having gaps among them.

Subsequently, the resin type adhesive agent 3 is applied on one surface part of the metal member to be joined with the resin member, on which the anodic oxide film 6 has been formed, in this case, on either surface at the forward end part of the inner lead 1. This resin type adhesive agent 3 should be selected from the standpoint of heat resistance, adhesiveness with the resin member (resin film), and so on. In the case of using polyimide as the resin member, the same polyimide type adhesive agent would be suitable. In the next place, the resin film 2 such as polyimide, etc. as the resin member is positioned at and glued onto the portion where the resin type adhesive agent 3 has been applied. At this gluing step, there may be effected heating and pressing depending upon the curing conditions of the resin type adhesive agent 3. Thereafter, the lead frame, to which the resin film 2 has been joined, is washed with an acid solution to thereby dissolve and remove the anodic oxide film 6 at those portions other than the above-mentioned joined portion. Up to this process step, the intended lead frame is completed, and a further step of mounting the semiconductor element 4 may be effected. Before that, however, with a view to increasing reliability in the connection of the wire-bonding by use of the thin metal wires 5, it may be feasible to effect ordinary plating with silver, gold, etc. onto the surface at the forward end part of the inner lead 1, where no resin film 2 has been attached.

In the above-mentioned example, mention has been made as to the case of using a copper alloy for the metal member to constitute the skeleton of the lead frame. In the case, however, of using an iron alloy such as 42 alloy, etc., a copper plating is once effected on the portion of the metal member of the lead frame made of the iron alloy, thereby making it possible to form the anodic oxide film 6 of copper or a copper alloy in the same manner as mentioned above. Thenceforward, the lead frame of the present invention can be obtained in the same process steps as in the above example.

As the resin member, there may be employed a resin plate such as glass/epoxy plate, etc., besides the above-mentioned resin film. One example of joining the glass/epoxy plate with the metal member is to position and laminate the metal member on a prepreg composed of glass fiber and epoxy resin, followed by pressing the combination under heat. During this process step, the epoxy resin penetrates into numerous gaps in the aggregate constituted with the acicular crystals in the anodic oxide film, and becomes solidified, whereby sufficiently rigid connection between the metal member and the resin member is possible.

In the following, explanations will be given as to another embodiment of the lead frame which is constructed with two or more metal members joined together with a resin type adhesive agent.

Figure 4:
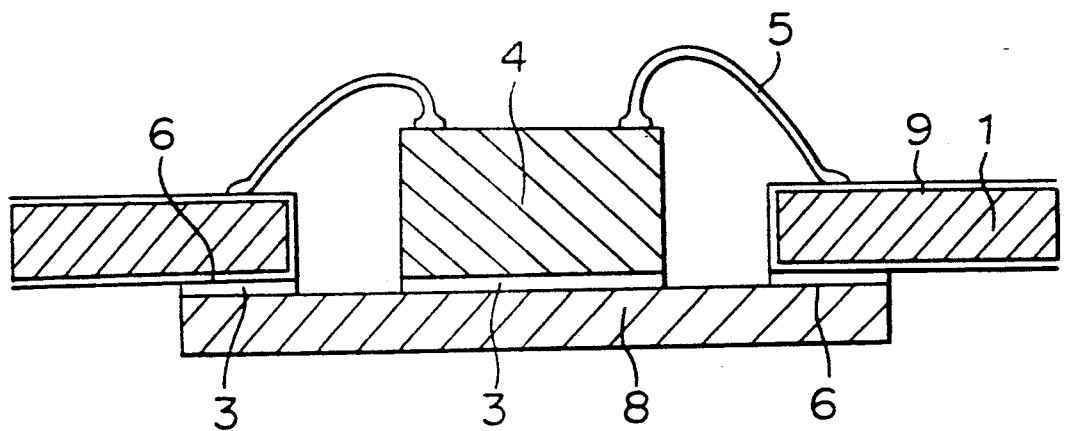
FIG. 4 is a cross-sectional view of a lead frame according to another embodiment of the present invention.
Figure 5:
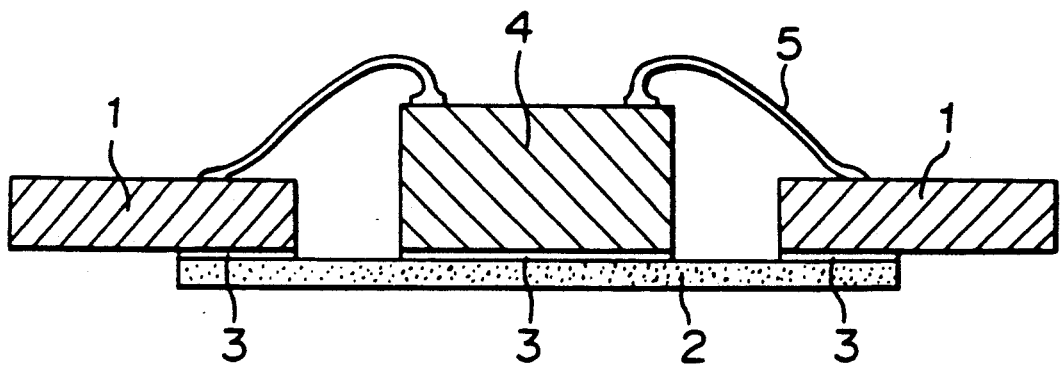
FIG. 5 is a cross-sectional view of a conventional lead frame.

FIG. 4 illustrates another embodiment of the lead frame according to the present invention, wherein a reference numeral 1 designates an inner lead of an iron alloy, which is a part of one of the metal members constituting the lead frame; and a numeral 8 refers to a copper plate which is the other metal member of the lead frame, and has a function as the element-mounting member. Copper plating 9 is effected on this inner lead 1, and both inner lead 1 and copper plate 8 are joined together with a resin type adhesive agent 3 through an anodic oxide film 6 formed on the surface of the copper plating 9 and the copper plate 8. In the same manner as the above-described example, since this anodic oxide film 6 is principally composed of an aggregate of acicular crystals having gaps among them, the resin type adhesive agent 3 penetrates into the numerous gaps formed by the aggregate of the acicular crystals, and becomes solidified to attain the anchoring effect by the acicular crystals with the consequence that, even when impact force or thermal stress is exerted between the inner lead 1 and the copper plate 8, the peeling phenomenon at the above-mentioned interface is difficult to take place, hence good heat conductivity of the copper plate 8 is not impaired.

In the following, the results of tests carried out for verifying the effect of the present invention will be explained.

With a view to verifying that the adhesive property of a metal member and a resin member constituting a lead frame according to the present invention, both metal member and resin member were joined together to test its adhesive property. In carrying out this test, since the shape of the inner lead of the lead frame would possibly yield errors in its measurement precision, due to the configurational factor, a metal member in a strip form having a width of 10 mm was joined to a resin member, and its adhesiveness was evaluated.

<Method of the Present Invention>

First of all, an alloy consisting of Cu, 2% Sn and 0.2% Ni in the form of a strip having a thickness of 0.15 mm and a width of 10 mm was subjected to anodic oxidation under the following conditions to thereby form on its surface an anodic oxide film of copper, which is principally composed of an aggregate of acicular crystals having gaps among them.

| Conditions for Anodic Oxidation | |
| --- | --- |
| Composition of electrolytic liquid | 1.2 mol sodium hydroxide |
| Current density of anode | 0.25 A/dm$^2$ |
| Temperature | 50° C. |

In the above-described manner, the copper alloy which is a metal member, on which the anodic oxide film has been formed, is joined with a resin member. In this case, a glass/epoxy plate was selected for the resin member so as to avoid expansion of the resin during the test for adhesive property. In more detail, a prepreg composed of 50% by weight of glass fibers and 50% by weight of epoxy resin was laminated on the copper alloy, with the above-mentioned anodic oxide film having been formed thereon, and the laminate was pressed uniformly, while maintaining a pressure at 40 kg/cm$^2$ and a temperature at 170° C., thereby fabricating a joined member which was free from voids and warp.

<Comparative Method 1>

As a comparative method to the above-mentioned method of the present invention, a copper alloy plate of the same shape and composition was used, as it was, without subjecting it to the anodic oxidation. Using this copper alloy plate, a laminated and joined member was fabricated under exactly same conditions as those in the method of the present invention.

<Comparative Method 2>

As another comparative method to the above-mentioned method of the present invention, a copper alloy plate of the same shape and composition was subjected to chemical oxidation treatment. Using this copper alloy plate, a laminated and joined member was fabricated under exactly the same conditions as those in the method of the present invention.

| Conditions for Chemical Oxidation | | |
| --- | --- | --- |
| Composition of bath: | sodium chlorite | 30 g/l |

-continued

| | Conditions for Chemical Oxidation | |
|---|---|---|
| | sodium hydroxide | 10 g/l |
| | sodium phosphate | 10 g/l |
| Temperature: | 85° C. | |

The laminated and joined members thus obtained in accordance with the method of the present invention as well as the comparative methods 1 and 2 were subjected to tests for their adhesive property in the under-mentioned manners.

Method for Testing Adhesive Property

Each of the laminated and joined members was held movable in the horizontal direction on a tension tester. While moving this laminated and joined member, one end of the joined copper alloy plate having a width of 10 mm was pulled up in the vertical direction to measure the peeling strength thereof at that time.

The results of the test for the adhesive property are as shown in Table 1 below. From these test results, it has been verified that the laminated and joined member according to the method of the present invention exhibits excellent adhesive property with respect to those laminated and joined members obtained by the comparative methods.

TABLE 1

| | Oxide Film | Method of Oxidation | Peeling Strength (kgf/10 mm width) |
|---|---|---|---|
| Present Inventive Method | Present | Anodic oxidation | 2.6–3.0 |
| Comparative Method 1 | Absent | — | 0.6–0.9 |
| Comparative Method 2 | Present | Chemical oxidation | 1.2–1.8 |

So far, the explanations have been given by taking, as examples, the test results which are suitable for verifying the effect of the present invention. Needless to say, however, there can be obtained the results having same significant differences, even in the lead frame having a smaller joining portion than that in the above-described test.

Thus, according to the present invention, since the copper oxide film, the principal structure of which is composed of an aggregate of acicular crystals having gaps among them is formed on the surface of the metal member of the lead frame, there can be obtained excellent adhesive property between the metal member and the resin member to be joined together, and occurrence of peeling between the two members can be effectively prevented, even when a force to peel off this joined interface is exerted.

Although, in the foregoing, the present invention has been described with reference to preferred examples thereof, the invention is not limited to these examples alone, but any changes and modifications may be made without departing from the spirit and scope of the invention as recited in the appended claims.

Obviously, numerous modifications and variations of the present invention are possible in light of the above teachings. It is therefore to be understood that within the scope of the appended claims, the invention may be practiced otherwise than as specifically described herein.

What is claimed is:

1. A lead frame, comprising:
   (1) a metal member, wherein a portion of a surface of said metal member has an anodic oxide film of a metal selected from the group consisting of copper and a copper alloy; and
   (2) a member selected from the group consisting of a resin film and a resin plate;
   wherein said member is connected to said portion of said surface having an anodic oxide film by a process selected from the group consisting of gluing and pressing under heat.

2. The lead frame according to claim 1, wherein said metal member is at least one member selected from the group consisting of copper, copper alloys, and alloys plated with copper.

3. The lead frame according to claim 1, wherein said resin film is a polyimide film.

4. The lead frame according to claim 1, wherein said resin plate is a glass/epoxy plate composed of glass fibers and an epoxy resin.

5. A lead frame comprising at least two metal members, wherein a portion of a surface of each metal member has an anodic oxide film of a metal selected from the group consisting of copper and a copper alloy, and wherein said at least two metal members are joined to each other by a resin type adhesive which is disposed between said portion of a surface of each metal member having an anodic oxide film.

6. The lead frame according to claim 5, wherein said metal member is at least one member selected from the group consisting of copper, copper alloys, and alloys plated with copper.

* * * * *